United States Patent
Kim et al.

(10) Patent No.: US 7,282,759 B2
(45) Date of Patent: Oct. 16, 2007

(54) MEMORY DEVICE HAVING SERIALLY CONNECTED RESISTANCE NODES

(75) Inventors: Won-joo Kim, Suwon-si (KR); Yoon-dong Park, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 23 days.

(21) Appl. No.: 11/376,423

(22) Filed: Mar. 16, 2006

(65) Prior Publication Data

US 2006/0231887 A1 Oct. 19, 2006

(30) Foreign Application Priority Data

Apr. 13, 2005 (KR) ............... 10-2005-0030743

(51) Int. Cl.
*H01L 29/76* (2006.01)
(52) U.S. Cl. .................. 257/315; 257/379; 257/536; 257/539; 257/E29.3
(58) Field of Classification Search ................ 257/314, 257/315, 378, 379, 536, E29.3
See application file for complete search history.

(56) References Cited

U.S. PATENT DOCUMENTS

| | | | | |
|---|---|---|---|---|
| 6,563,220 B2 * | 5/2003 | Gonzalez et al. | ............ | 257/758 |
| 6,841,833 B2 * | 1/2005 | Hsu et al. | .................. | 257/379 |
| 7,002,837 B2 * | 2/2006 | Morimoto | .................. | 365/148 |
| 2004/0174732 A1 | 9/2004 | Morimoto | .................. | 365/148 |
| 2006/0289942 A1 * | 12/2006 | Horii et al. | ................. | 257/379 |

OTHER PUBLICATIONS

C. Rossel et al., "Electrical Current Distribution Across A Metal-Insulator-Metal Structure During Bistable Switching" Journal of Applied Physics. vol. 90, No. 6, pp. 2892-2898. Sep. 15, 2001.

Korean Office Action dated May 26, 2006 (with English translation).

* cited by examiner

*Primary Examiner*—T. N. Quach
(74) *Attorney, Agent, or Firm*—Harness, Dickey & Pierce, P.L.C.

(57) ABSTRACT

A memory device may include a plurality of resistance nodes. The resistance nodes may be connected serially in a NAND or AND structure, by a plurality of metal plugs. The metal plugs may have a lower resistance. A control device corresponding to each resistance node may control the resistance devices. Each control device may be connected to a bit line and a word line. The bit line may be connected to the metal plugs via a corresponding switch device.

20 Claims, 6 Drawing Sheets

MEMORY DEVICE HAVING SERIALLY CONNECTED RESISTANCE NODES

PRIORITY STATEMENT

This application claims priority under 35 U.S.C. §119 to Korean Patent Application No. 10-2005-0030743, filed on Apr. 13, 2005, in the Korean Intellectual Property Office (KIPO), the entire contents of which is incorporated herein by reference.

BACKGROUND OF THE INVENTION

1. Field of the Invention

Example embodiments of the present invention relate to semiconductor memory devices, for example, non-volatile memory (NVM) devices having resistance nodes.

2. Description of the Related Art

Non-volatile memory (NVM) devices may be classified as threshold voltage transition devices, charge displacement devices or resistance varying devices. Depending on the type of a storage node, threshold voltage transition devices may be classified as flash memory devices with a floating gate or SONOS devices with a charge trapping layer. Charge displacement devices may be classified as nano-crystal ferroelectric RAM (FRAM) devices or polymer devices. Resistance varying devices my be classified as magnetic RAM (MRAM) devices, phase change RAM (PRAM) devices, resistance RAM (RRAM) using a compound metal oxide or polymer memory devices.

For example, related art resistance nodes used in a resistance memory may comprise a $SrZrO_3$ layer of which 0.2% may be doped with chromium (Cr).

FIGS. 1A and 1B are photographic images of an electron-beam-induced current (EBIC) of a related art resistance memory device and graphs illustrating current characteristics versus voltage characteristics relating to the EBIC. As shown, the resistance of a resistance node may vary as a sweeping voltage is applied to both terminals of the resistance node. The resistance node may vary from a higher resistance state (e.g., R=606 kΩ) in an initial stage as illustrated in FIG. 1A to a lower resistance state (e.g., R=10.5 kΩ) when a voltage is lowered less than −8 V as illustrated in FIG. 1B. White points in the EBIC photos indicate conductive paths.

Referring to the EBIC photos, since the resistance node varies from the higher resistance state to the lower resistance state, the white points which are the conductive paths may become larger (e.g., the white points indicated by arrows). The conductive paths may be locally (not wholly) formed on the resistance node when an amount of current flowing through the resistance node varies (e.g., when the resistance of the resistance node varies), as shown in FIGS. 1A and 1B.

FIG. 2 is a sectional view illustrating the shape of a filament of the resistance memory device of FIG. 1. Referring to FIG. 2, a conductive path 80 may be disposed between two electrodes 50 and 60 via a resistance node 70. The conductive path 80 may be formed in the shape of a filament as shown in FIGS. 1A and 1B.

FIG. 3 is a sectional view illustrating the shape of the filament of a related art NAND-type resistance memory device in a block erasure operation. As shown, when the resistance node 70 having a NAND structure is serially connected, the conductive path 80 in the shape of the filament may not be connected to the length direction of the resistance node 70. In this example, a resistance node region H may utilize the disconnected conductive path 80 has a higher resistance path, such that the resistance node 70 may not be easily changed to the lower resistance state. According to the related art, a NAND-type or AND-type resistance memory device having serially connected resistance node 70 may not be operated in a unit block at a time.

SUMMARY OF THE INVENTION

Example embodiments of the present invention provide memory devices having serially connected resistance nodes that may be operated in a unit block and selectively combined (e.g., hybrid-combined) with a charge storage node.

According to an example embodiment of the present invention, a memory device may comprise a plurality of resistance nodes each of which may include a first terminal and a second terminal. The plurality of resistance nodes may have resistance characteristics that vary according to an applied voltage. A metal plug may be disposed between a first terminal of each of the plurality of resistance nodes and a second terminal of another of the plurality of resistance nodes. The metal plugs may have a lower resistance than the plurality of resistance nodes. A plurality of control devices, each corresponding to a respective one of the plurality of resistance nodes, may include a first, second and third terminal. The third terminal may control current flowing between the first and second terminals. A bit line may connect a first terminal of each control device to a second terminal of another control device thereby serially connecting the control devices. A switch device may be arranged between the bit line and each metal plug. The switch device may control current flowing between the bit line and the metal plugs. Each of a plurality of word lines may be connected to the third terminal of a corresponding control device.

According to another example embodiment of the present invention, a memory device may comprise a plurality of resistance nodes. Each of the plurality of resistance nodes may include a first terminal and a second terminal, and may have resistance characteristics that vary according to an applied voltage. A metal plug may be arranged between the first terminal of each resistance node and the second terminal of another resistance node, thereby serially connecting the resistance nodes. The metal plugs may have a lower resistance than the resistance nodes. A plurality of charge storage nodes, each one of which corresponds to a respective resistance node, and stores charges. Each charge storage node may have a corresponding source, drain and control gate. A bit line may connect (e.g., sequentially connect) the source corresponding to one charge storage node and the drain corresponding to another charge storage node. A switch device may be arranged between the bit line and each metal plug. Each switch device may control current flowing between the bit line and a respective metal plug. A word line may be connected to each control gate.

According to another example embodiment of the present invention, a memory device may comprise a plurality of resistance nodes. Each of the plurality of resistance nodes may include a first terminal and a second terminal, and may have resistance characteristics that vary according to an applied voltage. A metal plug may be arranged between the first terminal of each resistance node and the second terminal of another resistance node, thereby serially connecting the resistance nodes. The metal plugs may have a lower resistance than the resistance nodes. Each resistance node may have a corresponding bipolar transistor. Each bipolar transistor may include an emitter, a collector and a base. A bit line may connect the emitter of each bipolar transistor to the collector of another bipolar transistor. A switch device may be arranged between the bit line and each metal plug. Each switch device may control current flowing between the bit line and a respective metal plug. A word line may be connected to each base.

In example embodiments of the present invention, the resistance nodes may be comprised of $Nb_2O_5$, Cr doped $SrTiO_3$, $ZrO_x$, $GST(GeSb_xTe_y)$, NiO, $TiO_2$, or HfO film. The switch devices may be comprised of a transition metal oxide TMO. The TMO may be electrically conductive when a voltage greater than a critical voltage is applied thereto. The TMO may be comprised of, for example, $V_2O_5$ and TiO. The resistance nodes may be connected an NAND structure or an AND structure.

BRIEF DESCRIPTION OF THE DRAWINGS

The present invention will become more apparent by describing in example embodiments as shown in the attached drawings in which.

DETAILED DESCRIPTION OF EXAMPLE EMBODIMENTS OF THE PRESENT INVENTION

Figure 1:
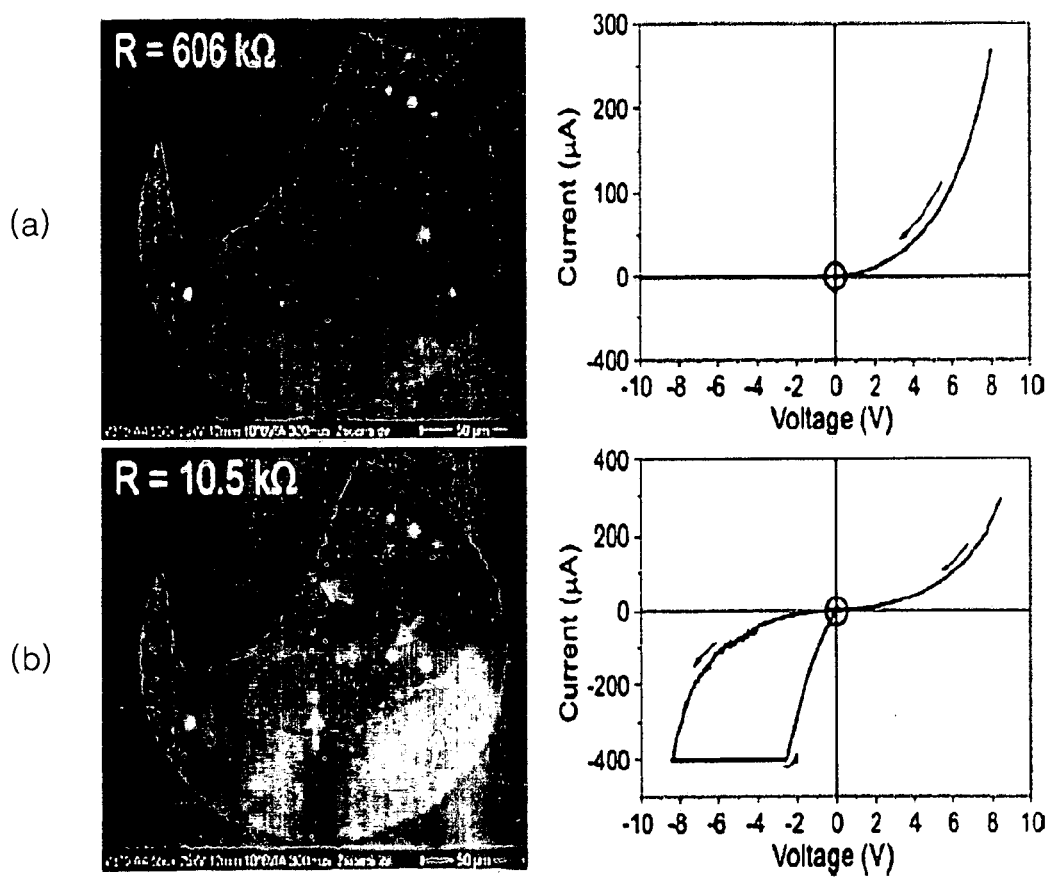
FIGS. 1A and 1B are photographic images of an electron-beam-induced current (EBIC) of a related art resistance memory device and graphs illustrating current versus voltage characteristics relating to the EBIC.
Figure 2:
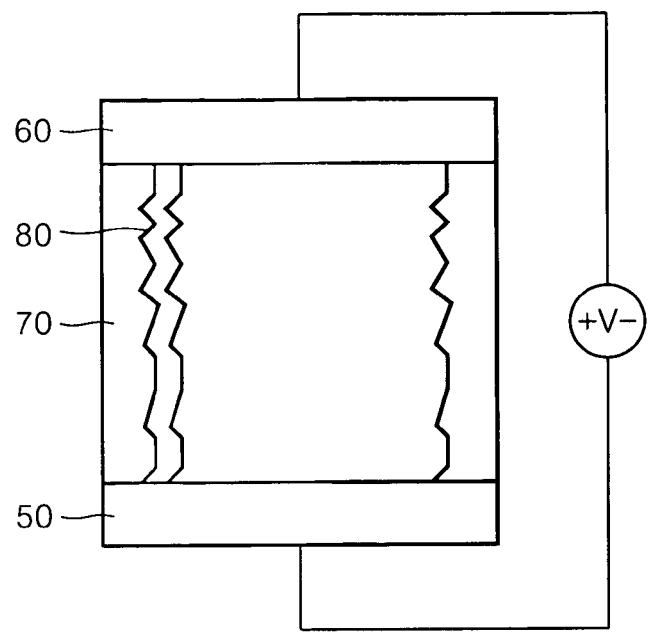
FIG. 2 is a cross-sectional view illustrating the shape of a filament of the related art resistance memory device of FIG. 1.
Figure 3:
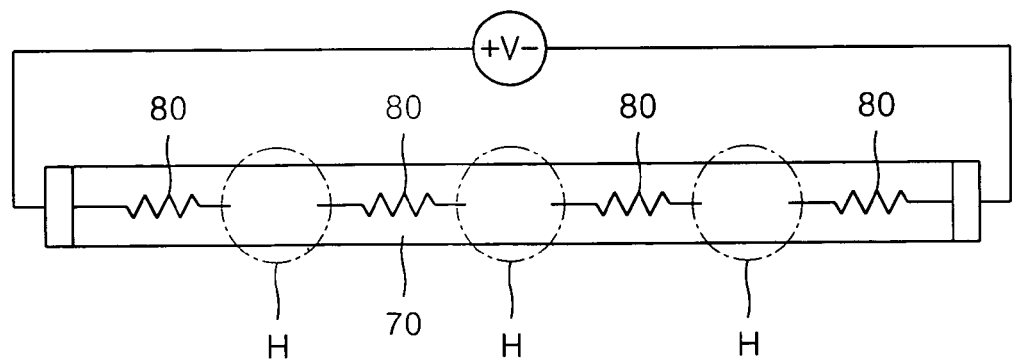
FIG. 3 is a cross-sectional view illustrating the shape of the filament of a related art NAND-type resistance memory device in a block erasure operation.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited)to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 4:
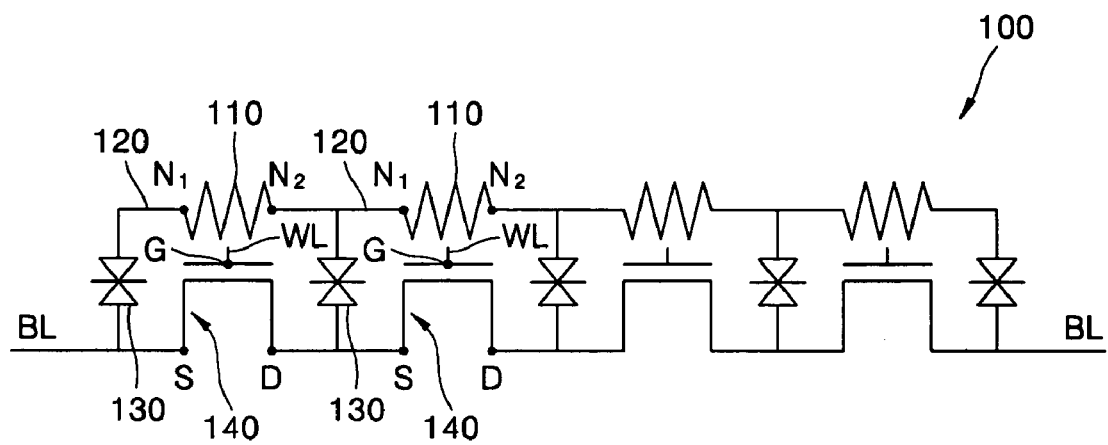
FIG. 4 is a circuit diagram illustrating a memory device according to an example embodiment of the present invention.

FIG. 4 is a circuit diagram illustrating a memory device according to an example embodiment of the present invention. As shown, a memory device 100 may comprise serially connected resistance nodes 110, control devices 140, switch nodes 130 and/or metal plugs 120. The control devices 140 may be connected to a bit line BL and word lines WL, and the metal plugs may connect the bit line BL and the resistance nodes 110.

Each of the resistance nodes 110 may include a first terminal N1 and a second terminal N2 on respective sides, and a metal plug 120 may be disposed between the resistance nodes 110 to connect the first terminal N1 of one resistance node 110 to the second terminal N2 of another resistance node 110, such that the resistance nodes 110 may be serially connected. The metal plugs 120 may be connected to the switch devices 130, respectively. The sources S and the drains D of the control devices 140 may be connected to the switch devices 130, respectively. The bit line BL may be connected to the switch devices 130, the sources S, and the drains D. The bit line BL may connect one source S of one control device 140 and one drain D of another neighboring control device 140. The word lines WL may be connected to gates G of the control devices 140, respectively.

As shown in FIG. 4, a first circuit may connect (e.g., sequentially connect) the bit line BL, one switch device 130, one metal plug 120, one resistance node 110, another switch device 130 and the bit line BL. A second circuit may connect (e.g., sequentially connect) the bit line BL, the sources S, the drains D and the bit line BL. The switch devices 130 and the gates G may select and/or control the first and second circuits, which will be described later in detail.

A unit cell may comprise one resistance node 110, one control device 140 corresponding to the resistance node 110, the switch devices 130 and/or the metal plugs 120. The metal plugs 120 may connect the resistance node 110 and the control device 140 in the memory device 100. For example, the memory device 100 may have serially connected unit cells, for example, a NAND structure or an AND structure. Although the bit line BL illustrated in FIG. 4 is singular, the bit line BL may be plural.

The control devices 140 may be transistors (e.g., MOS transistors) having sources S, the drains D, and the gates G. In at least one example embodiment, MOS transistors may control a voltage applied to the gates G, and form a channel (not shown) between the sources S and the drains D. The channel may be a conductive path. After the channel is formed, the sources S and the drains D of the MOS transistors may be electrically connected. The MOS transistors may be, for example, NMOS transistors having an n-type channel or PMOS transistors having a p-type channel.

Figure 6:
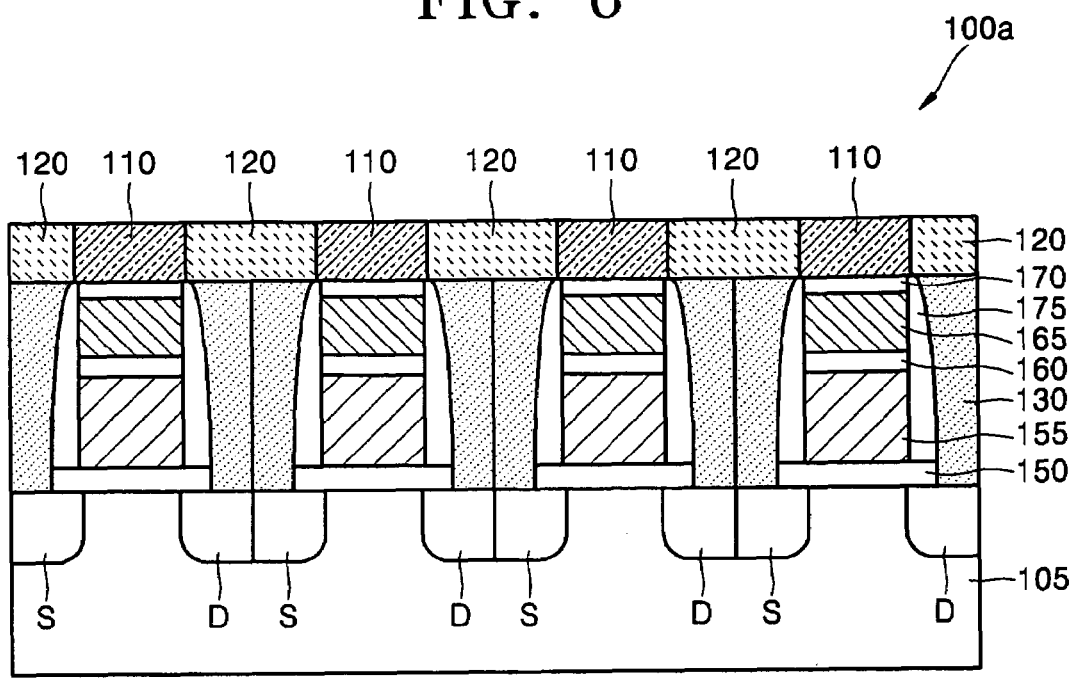
FIG. 6 is a cross-sectional view illustrating a structure of the memory device of FIG. 4.

The control devices 140 may be unit cells of flash memories and/or SONOS memories having a charge storage node (e.g., reference numeral 155 of FIG. 6). Flash memories may use a floating gate, for example, a poly silicon layer, as the charge storage node, and SONOS memories may use a charge trap layer, for example, a silicon nitride layer, as the charge storage node. In this example, the memory device 100 may have a hybrid structure in which two different types of storage node, the resistance node 110 and the charge storage node (e.g., reference numeral 155 of FIG. 6), are combined, and will be described later with reference to FIG. 9.

FIG. 6 is a cross-sectional view illustrating a structure 100a of the memory device 100 of FIG. 4. Referring to FIG. 6, the control device 140 of FIG. 4 illustrates an example unit cell of a flash memory and/or a SONOS memory including a charge storage node 155. The control device 140 of FIG. 4 may include sources S and drains D in a semiconductor substrate 701, a first insulating layer 150, the charge storage node 155, a second insulating layer 160 and/or a control gate electrode 165 on the semiconductor substrate 105. Since the control devices 140 may be more easily understood by those of ordinary skill in the art, detailed descriptions are omitted.

Switch devices 130 may be formed on the sources S and drains D, and may be insulated from the charge storage node 155 and the control gate electrode 165 by a spacer insulating layer 175. Resistance nodes 110 may be formed on a third insulating layer 170 formed on the control gate electrode 165, and metal plugs 120 may be formed on the switch devices 130. The metal plugs 120 connect the resistance nodes 110 and the switch devices 130, and connect the resistance nodes 110, such that the resistance nodes 110 may be connected (e.g., serially connected). The metal plugs 120 may be composed of a metal film having a lower resistance than the resistance nodes 110, for example, tungsten (W), aluminum (Al), titanium (Ti), platinum (Pt), ruthenium (Ru), copper (Cu), cobalt (Co) or the like. The structure 100a of the memory device 100 may be a NAND or AND structure in which the resistance nodes 110 and the control devices 140 may be combined.

Figure 7:
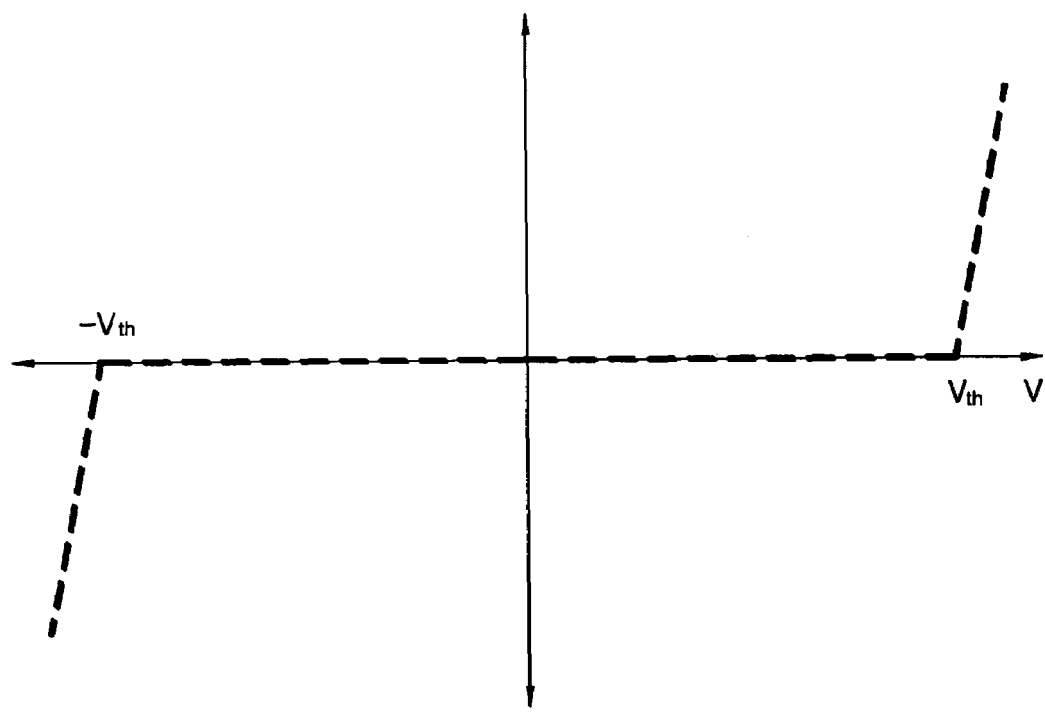
FIG. 7 is a graph illustrating current flow through the memory device of FIG. 4.

FIG. 7 is a graph illustrating current characteristics versus voltage characteristics of the switch devices 130 of the memory device 100 of FIG. 4. The switch devices 130 will now be described in detail with reference to FIG. 7. If a voltage applied to both nodes of the switch devices 130 is less than a critical voltage (e.g., $-V_{th}$ to $V_{th}$) on the basis of an absolute value, current may not flow through the switch devices 130. If the voltage applied to both nodes of the switch devices 130 is greater than the critical voltage (e.g., less than $-V_{th}$ or greater than $V_{th}$) on the basis of the absolute value, current may increasingly flows through the switch devices 130. The switch device 130 may be used as a rectifying diode. Therefore, the switch devices 130 may control a current flow from the bit line BL to the resistance nodes 110. The switch devices 130 may be composed of transition metal oxide (TMO), for example, $V_2O_5$, TiO or the like.

The resistance nodes 110 may be variable resistance storage materials according to a voltage applied thereto. For example, the resistance nodes 110 may be composed of $Nb_2O_5$, Cr doped $SrTiO_3$, $ZrO_x$, GST($GeSb_xTe_y$), NiO, $TiO_2$, HfO film or the like.

Figure 8:
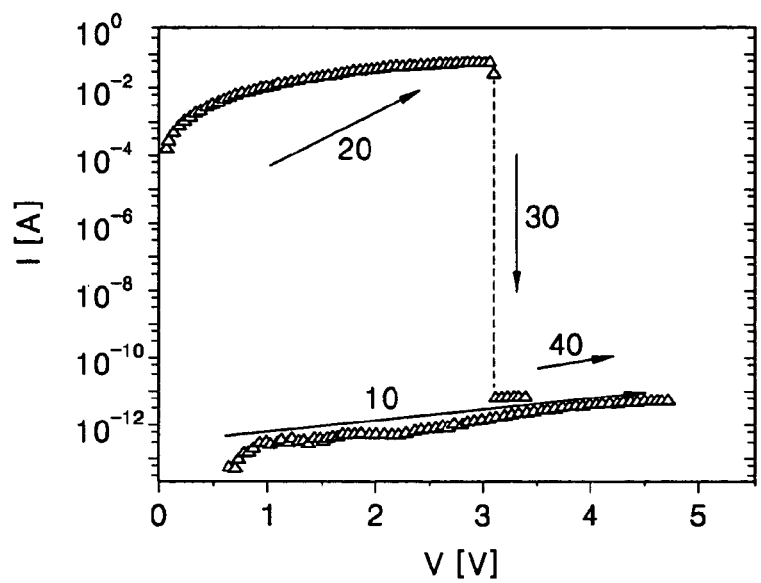
FIG. 8 is a graph illustrating current versus voltage characteristics of resistance nodes of a memory device, according to an example embodiment of the present invention.

FIG. 8 is a graph illustrating current characteristics versus voltage characteristics of the resistance nodes 110 of the memory device 100 of FIG. 4. As shown, if an initial voltage is applied to the resistance nodes 11 (path 10), current may not flow through the resistance nodes 110, which may be composed of NiO until a critical voltage is increased to 4.5V. In this example, the resistance nodes 110 may have a higher resistance value (e.g., a reset state).

If the voltage applied to the resistance nodes 110 is greater than the critical voltage, current may increasingly flow through the resistance nodes 110. After the voltage greater than the critical voltage is applied to the resistance nodes 110, if a voltage is again applied from zero (path 20), higher current may flow through the resistance nodes 110 (e.g., a set state).

If the voltage applied to the resistance nodes 110 is greater than the voltage of the reset state, current may decreasingly flow through the resistance nodes 110 (path 30). For example, the resistance node 110 may regain a higher resistance value as in the reset state. If the voltage is increasingly applied to the resistance nodes 110 (path 40), a path may be the same or substantially the same as the path of the reset state.

When the critical voltage or the reset voltage is applied to the resistance nodes 110, the resistance nodes 110 may have a different resistivity within some voltage ranges even after applied voltage is removed. Therefore, the resistance nodes 110 may be used as storage media of NVM devices.

Figure 9:
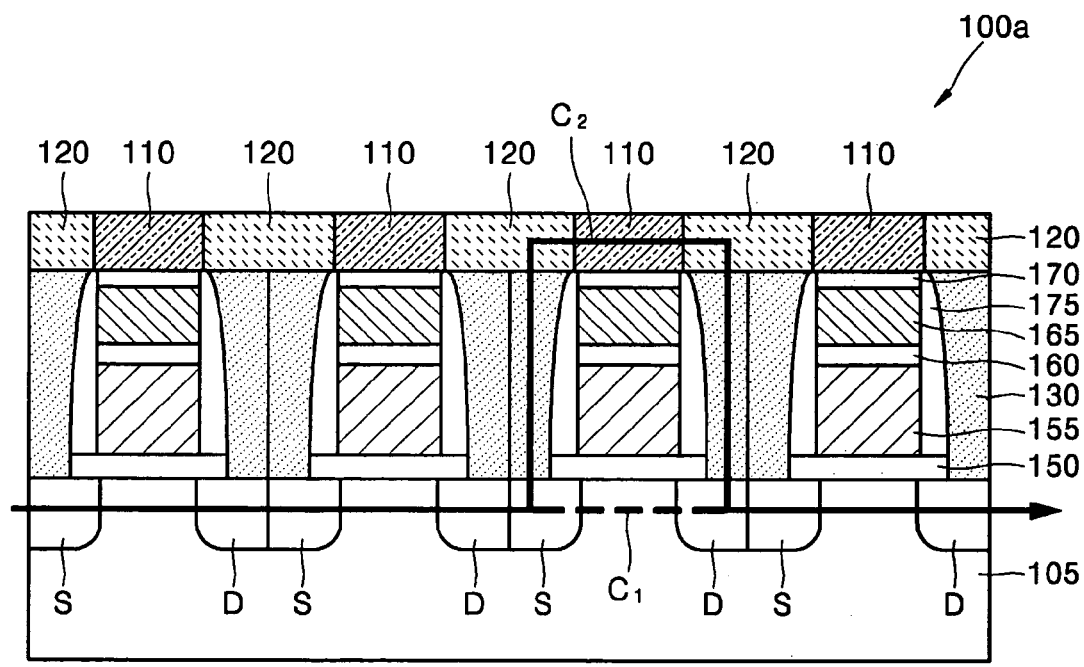
FIG. 9 is a cross-sectional view illustrating an operation of the memory device of FIG. 4.

FIG. 9 is a cross-sectional view illustrating an operation of the memory device 100 of FIG. 6 having the charge storage node 155 and the resistance nodes 110. In a serially connected to structure, for example, a NAND structure, the switch devices 130 connected one of the resistance nodes 110, for example, a third resistance node 110, may be turned on in order to select the third resistance node 110. A third control device 140 corresponding to the third resistance node 110 may be turned off and the other control devices 140, for example, first, second and fourth control devices 140 may be turned on. Electron or current flowing through the bit line BL may flow though a circuit C2 connecting the sources S, the third resistance node 110, and the drains D.

The resistance nodes 110 may be in the set state or the reset state as described with reference to FIG. 8 by controlling the voltage applied to the resistance nodes 110. For example, data bit values of 0 and 1 may be stored in the memory device 100 using the resistance nodes 110. As the resistance nodes 110 and the switch devices 130 may be connected to the metal plugs 120 having a lower resistance, an operating voltage necessary for the set state or the reset state of the resistance nodes 110 may be reduced. Because the length of the resistance nodes 110 is reduced by the length of the, metal plugs 120, opening of filaments (e.g., reference numeral 180 of FIG. 10) may be suppressed (e.g., prevented). The filament may be formed as the conductive path in the resistance nodes 110.

In order to store data bits in the memory device 100 using the charge storage node 155, electron or current flowing through the bit line BL may be directed through a circuit C1 connecting the sources S and the drains D. An operating voltage (e.g., a program voltage) may be applied to the control gate electrode 165 of the third control device 140. Because the program voltage is greater than a threshold voltage of the control devices 140, the third control device 140 may be turned on.

An erase operation of the resistance nodes 110 may be performed in a unit of serially connected blocks, for example, a NAND structure or an AND structure. The control devices 140 may be turned off, and a voltage for erasing blocks of the resistance nodes 110 may be applied to the bit line BL. If 0.5 Volts are required to erase one resistance node 110, 16 Volts are required to erase the NAND structure in which thirty-two resistance nodes 110 are connected.

Figure 10:
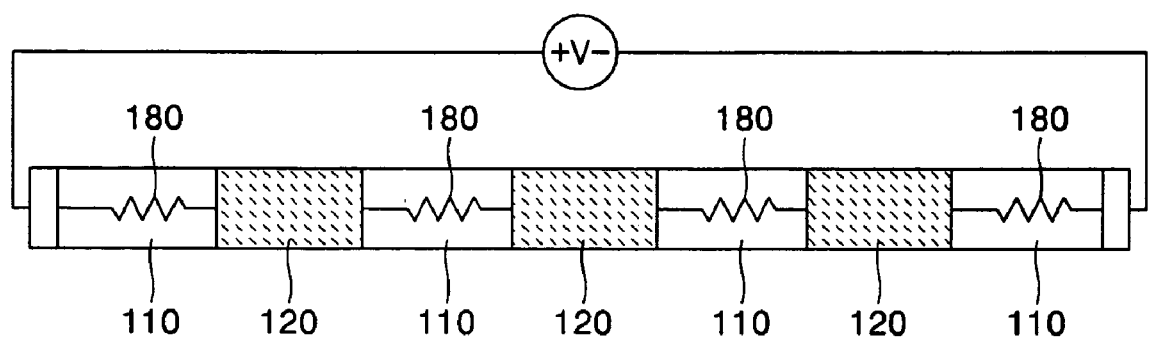
FIG. 10 is a cross-sectional view illustrating an operation of erasing blocks of resistance nodes of the memory device of FIG. 4.

FIG. 10 is a sectional view illustrating an operation of erasing blocks of serially connected resistance nodes 110 of the memory device 100 of FIG. 9. Current flowing through the resistance nodes 110 may flow via local filaments 180. The metal plugs 120 disposed between the resistance nodes 110 may connect the filaments 180 between the resistance nodes 110. The metal plugs 120 may provide nucleation sites required to more easily form the filaments 180.

The metal plugs 120 having a lower resistance than the resistance nodes 110 may be disposed between the resistance nodes 110, thereby erasing blocks of the resistance nodes 110 with a lower voltage than that of a related art resistance node. For example, a voltage required to erase the blocks of the resistance nodes 110 may be reduced by more than half. The voltage may be reduced by replacing about half of the resistance nodes 110 with metal plugs 120 having lower resistances, and by suppressing (e.g., preventing) the opening of the filaments 180.

Figure 5:
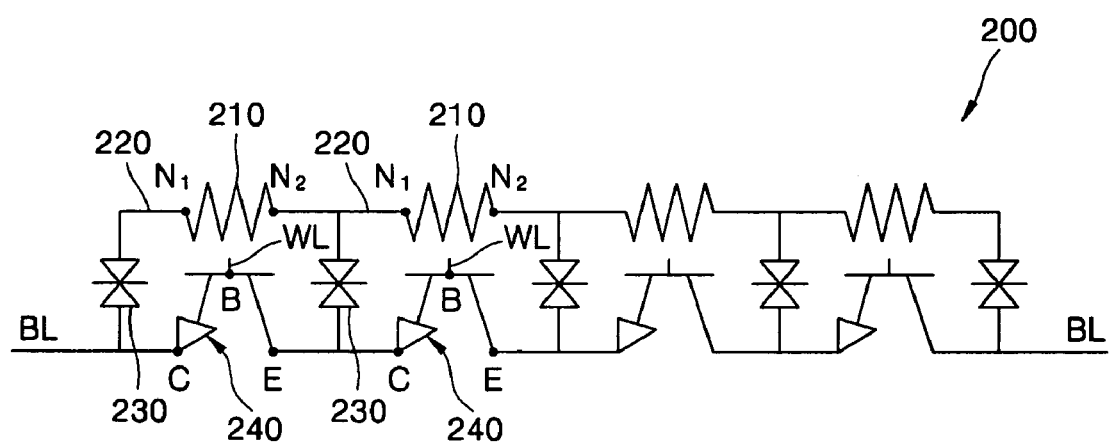
FIG. 5 is a circuit diagram illustrating a memory device according to another example embodiment of the present invention.

FIG. 5 is a circuit diagram illustrating a memory device 200 according to another example embodiment of the present invention. As shown, the memory device 200 may comprise serially connected resistance nodes 210, bipolar transistors 240, switch nodes 230 and metal plugs 220. The bipolar transistors 240 may connect to a bit line BL and word lines WL. The switch nodes 230 and metal plugs 220 may connect the bit line BL and the resistance nodes 210.

In at least this example embodiment, each of the resistance nodes 210 may include a first terminal N1 and a second terminals N2 on respective sides thereof, and the metal plugs 220 may be disposed between the resistance nodes 210 to connect the first terminal N1 of one resistance node 210 to the second terminal N2 of another resistance node 210, such that the resistance nodes 210 can be serially connected. The metal plugs 220 may be connected to the switch devices 230, respectively. Emitters E and collectors C of the bipolar transistors 240 may be connected to the switch devices 230, respectively. The bit line BL may be connected to the switch devices 230, the emitters E, the collectors C and the switch devices 230. The bit line BL may connect one emitter E of one bipolar transistor 240 and one collector C of another neighboring bipolar transistor 240. The word lines WL may be connected to bases B of the bipolar transistors 240, respectively.

A first circuit may sequentially connect the bit line BL, one switch device 230, one metal plug 220, one resistance node 210, another switch device 230 and the bit line BL. A second circuit may sequentially connect the bit line BL, the emitters E, the bases B, the collectors C and the bit line BL.

A unit cell including one resistance node 210, one bipolar transistor 240 corresponding to the resistance node 210, the switch devices 230 and the metal plugs 220 connecting the resistance node 210 and the bipolar transistor 240 may be formed in the memory device 200. For example, the memory device 200 may have connected (e.g., serially connected unit cells), for example, a NAND structure or an AND structure. Although the bit line BL illustrated in FIG. 5 is singular, the bit line BL may be plural.

The resistance nodes 210, the switch devices 230 and the metal plugs 220 of the memory device 200 may be understood with reference to the description of the memory device 100. The memory operation of the resistance nodes 210 may be more easily derived by those of ordinary skill in the art with reference to the description of the memory device 100. However, the memory device 100 may be different from the memory device 200 in that the memory device 100 may control current flowing between the sources S and the drains D via the gates G, whereas, the memory device 200 may control current flowing between the emitters E and the collectors C via the bases B.

Therefore, the memory device 200 may change the resistance nodes 210 to the set state or the reset state by selecting one resistance node 210. For example, the memory device 200 may store data bit values 0 and 1 using the resistance nodes 210. As described with reference to FIG. 10, the metal plugs 220, which have a lower resistance than the resistance nodes 210, may be disposed between the resistance nodes 210, thereby erasing blocks of the resistance nodes 210 with a lower voltage than that of a related art resistance node.

In example embodiments, the resistance nodes may be comprised of a phase change material film. The phase change material film may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material film is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, Sb2-Te3 or Ge—Te alloys; example quaternary phase-change chalcogenide alloys may include one or more of an Ag—In—Sb—Te, (Ge—Sn)—Sb—Te, Ge—Sb—(Se—Te) or Te81-Ge15-Sb2-S2 alloy, for example.

In an example embodiment, the phase change material film may be made of a transition metal oxide having multiple resistance states, as described above. For example, the phase change material may be made of at least one material selected from the group consisting of NiO, TiO2, HfO, Nb2O5, ZnO, WO3, and CoO or GST (Ge2Sb2Te5) or PCMO(PrxCa1-xMnO3). The phase change material film may be a chemical compound including one or more elements selected from the group consisting of S, Se, Te, As, Sb, Ge, Sn, In and Ag.

While example embodiments of the present invention have been shown and described with reference to the drawings, it will be understood by those of ordinary skill in the art that various changes in form and details may be made therein without departing from the spirit and scope of the present invention as defined by the following claims.

What is claimed is:

1. A memory device comprising:
   a plurality of resistance nodes each including a first terminal and a second terminal and having resistance characteristics that vary according to an applied voltage;
   a plurality of metal plugs, each metal plug being arranged between a first terminal of one of the plurality of resistance nodes and a second terminal of another of the plurality of resistance nodes, the metal plugs having lower resistances than the plurality of resistance nodes;
   a control device corresponding to each of the plurality of resistance nodes, each control device including a first, second and third terminal, the third terminal controlling current flow between the first and second terminals;
   a bit line serially connecting the control devices;
   a switch device arranged between the bit line and each metal plug, each switch device controlling current flow between the bit line and a corresponding metal plug; and
   a word line connected to a third terminal of each control device.

2. The memory device of claim 1, wherein the resistance nodes are comprised of at least one of $Nb_2O_5$, Cr doped $SrTiO_3$, $ZrO_x$, $GST(GeSb_xTe_y)$, NiO, $TiO_2$ and HfO film.

3. The memory device of claim 1, wherein the switch devices are composed of transition metal oxide (TMO).

4. The memory device of claim 3, wherein the transition metal oxide is electrically conductive only when a voltage greater than a critical voltage is applied thereto.

5. The memory device of claim 3, wherein the TMO is $V_2O_5$ or TiO.

6. The memory device of claim 1, wherein the metal plugs are comprised of at least one of tungsten (W), aluminum (Al), titanium (Ti), platinum (Pt), ruthenium (Ru), copper (Cu) and cobalt (Co).

7. The memory device of claim 1, wherein the control devices are MOS transistors, and the first terminal is a source, the second terminal is a drain, and the third terminal is a gate.

8. The memory device of claim 1, wherein each control device is a unit cell of a flash memory or SONOS memory.

9. The memory device of claim 1, wherein each control device further includes a charge storage node, and wherein the first terminal is a source, the second terminal is a drain and the third terminal is a control gate of the charge storage node.

10. The memory device of claim 9, wherein the bit line sequentially connects the source of each charge storage node to the drain of another charge storage node, and each of the word lines are connected to a respective control gate.

11. The memory device of claim 9, wherein the resistance nodes are comprised of at least one of $Nb_2O_5$, Cr doped $SrTiO_3$, $ZrO_x$, $GST(GeSb_xTe_y)$, NiO, $TiO_2$ and HfO film.

12. The memory device of claim 9, wherein the switch devices are composed of transition metal oxide (TMO).

13. The memory device of claim 12, wherein the TMO is composed of $V_2O_5$ and TiO.

14. The memory device of claim 9, wherein the resistance nodes are connected in one of an NAND structure and an AND structure.

15. The memory device of claim 1, wherein the control devices are bipolar transistors, and the first terminal is an emitter, the second terminal is a collector and the third terminal is a base.

16. The memory device of claim 15, wherein the bit line connects the emitter of each bipolar transistor to the collector of another bipolar transistor, and a word line connected to each the base of each bipolar transistor.

17. The memory device of claim 15, wherein the resistance nodes are comprised of at least one of $Nb_2O_5$, Cr doped $SrTiO_3$, $ZrO_x$, $GST(GeSb_xTe_y)$, NiO, $TiO_2$ and HfO film.

18. The memory device of claim 15, wherein the switch devices are composed of transition metal oxide (TMO).

19. The memory device of claim 15, wherein the TMO is composed of $V_2O_5$ and TiO.

20. The memory device of claim 15, wherein the resistance nodes are connected in one of an NAND structure and an AND structure.

* * * * *